United States Patent
Felder

(10) Patent No.: US 9,461,601 B2
(45) Date of Patent: Oct. 4, 2016

(54) MULTICHANNEL DIGITAL AUDIO INTERFACE

(71) Applicant: MAXIM Integrated Products, Inc., San Jose, CA (US)

(72) Inventor: Matthew D. Felder, Austin, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 198 days.

(21) Appl. No.: 14/279,197

(22) Filed: May 15, 2014

(65) Prior Publication Data

US 2014/0341398 A1 Nov. 20, 2014

Related U.S. Application Data

(60) Provisional application No. 61/825,514, filed on May 20, 2013.

(51) Int. Cl.
*H04R 3/00* (2006.01)
*H03F 3/20* (2006.01)
*H03F 3/217* (2006.01)

(52) U.S. Cl.
CPC ............... *H03F 3/20* (2013.01); *H03F 3/217* (2013.01)

(58) Field of Classification Search
None
See application file for complete search history.

(56) References Cited

U.S. PATENT DOCUMENTS

| | | | |
|---|---|---|---|
| 2012/0155589 A1* | 6/2012 | den Besten | H03L 7/0807 375/376 |
| 2013/0078827 A1* | 3/2013 | Yeh | H01R 12/88 439/76.1 |

\* cited by examiner

*Primary Examiner* — Regina N Holder
(74) *Attorney, Agent, or Firm* — TIPS Group

(57) ABSTRACT

A multichannel input device with automatic number-of-channels detection includes an automatic channel and bit depth detector, a digital audio interface (DAI), an analog device, and a digital-to-analog converter (DAC) coupling the DAI to the analog device. The automatic number-of-channels and bit depth detector has a BCLK input, a LRCLK input, a number of channels NCHAN output, and a bit depth B output. The DAI has a data DIN input, the BCLK input, the LRCLK input, an NCHAN input and a B input and has an output including data associated with an assigned channel.

16 Claims, 4 Drawing Sheets

| Mode | Bit Depth | # of Channels | BCLKs per Sample Period | First LRCLK Pulse Length # of BCLKs | LRCLK Duty Cycle | Second LRCLK Pulse Length | LRCLK Duty Cycle |
|---|---|---|---|---|---|---|---|
| Stereo I2S | 16 | 2 | 32 | 16 | 0.5 | 16 | 0.5 |
| Stereo I2S | 24 | 2 | 48 | 24 | 0.5 | 24 | 0.5 |
| Stereo I2S | 32 | 2 | 64 | 32 | 0.5 | 32 | 0.5 |
| TDM | 16 | 4 | 64 | 16 | 0.25 | 1 | <0.02 |
| TDM | 24 | 4 | 96 | 24 | 0.25 | 1 | <0.02 |
| TDM | 32 | 4 | 128 | 32 | 0.25 | 1 | <0.02 |
| TDM | 16 | 8 | 128 | 16 | 0.125 | 2 | <0.02 |
| TDM | 24 | 8 | 192 | 24 | 0.125 | 1 | <0.02 |
| TDM | 32 | 8 | 256 | 32 | 0.125 | 2 | <0.02 |
| TDM | 16 | 16 | 256 | 16 | 0.0625 | 1 | <0.02 |
| TDM | 24 | 16 | 384 | 24 | 0.0625 | 1 | <0.02 |
| TDM | 32 | 16 | 512 | 32 | 0.0625 | 2 | <0.02 |
| TDM | 16 | 32 | 512 | 16 | 0.03125 | 1 | <0.02 |
| TDM | 24 | 32 | 768 | 24 | 0.03125 | 1 | <0.02 |
| TDM | 32 | 32 | 1024 | 32 | 0.03125 | 1 | <0.02 |

Fig. 4

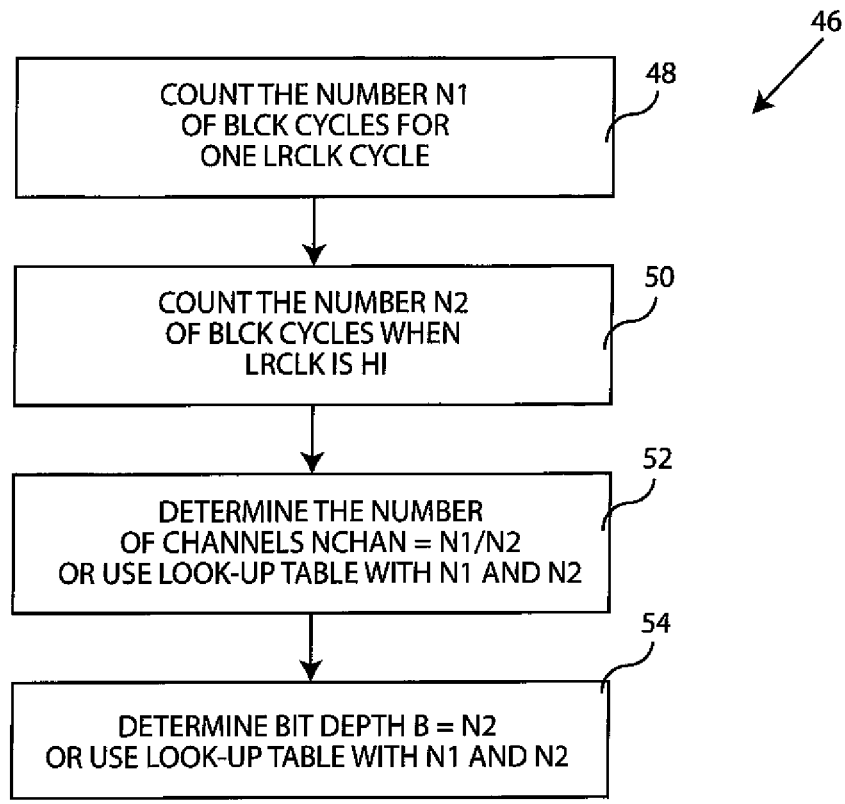
*Fig. 5*
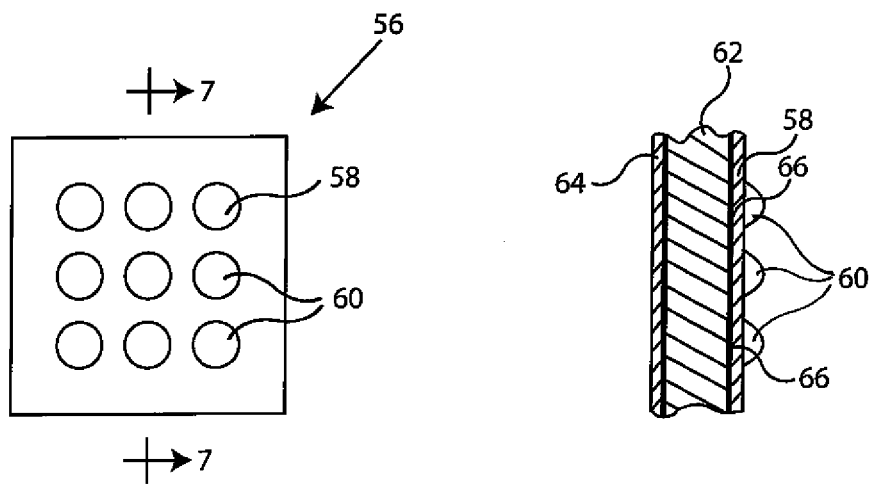
*Fig. 6*     *Fig. 7*

MULTICHANNEL DIGITAL AUDIO INTERFACE

CROSS REFERENCE TO RELATED APPLICATION(S)

This application claims the benefit of U.S. Ser. No. 61/825,514, filed May 20, 2013, which is incorporated herein by reference in its entirety.

BACKGROUND

Digitally controlled analog devices include devices such as amplifiers. When used for audio, such devices often include multiple channels. An example of an audio power amplifier is a digital pulse-code modulation (PCM) input Class D power amplifier. Such amplifiers may support time division multiplexed (TDM) data and may also support I2S data. TDM is a type of multiplexing in which two or more bit streams or signals are transferred appearing simultaneously as sub-channels in one communication channel, but physically taking turns on the channel.

I2S (also known as Inter-IC Sound, Integrated Interchip Sound, and IIS) is an electrical serial bus interface standard used for connecting digital audio devices together, e.g. to communicate PCM audio data between integrated circuits. The I2S requires at least three lines: a bit clock line, a word clock line, also known as a word select (WS), channel sync or left-right clock or (LRCLK) line, and at least one multiplexed data line. In the present example of a Class D power amplifier, the I2S lines can be used, for example, to configure the number of channels and bit depth of the interface.

The I2S digital interface with BCLK, LRCLK, and DIN are commonly used in most digital audio systems. The interface allows for a multiple channels of data to be sent over the shared DIN line. Each frame of data is aligned with the LRCLK signal. The DIN data within that frame can be any number of TDM channels with any number of bit depths. Normally the part will be programmed for the format of the TDM data using I2C. However, such programming of the data formatting can make the system more complex and, in some cases as described below, there may not be enough pins to support an I2C interface for such programming.

Some audio amplifier integrated circuits (ICs) are quite small and include only a few contacts on the IC package. These small ICs are useful in compact electronic devices such as cellular telephones, tablets and notebook computers. For example, a small wafer level package (WLP) may have only nine contacts (sometimes called "pads" or "balls") for interconnection with a printed circuit board. Providing I2C capabilities to such small packages can be problematical do to the limited number of available pads and, in some cases, there aren't enough contacts to support an I2C interface for the purpose of programming.

The problem of providing multiple data lines, such as I2S lines, to analog/digital devices having few leads, contacts, pads or the like extends beyond audio power amplifier devices, which were set forth only by way of example. The usual solution is to put such analog/digital devices in larger packages with more pins, which increases the form factor of the IC.

These and other limitations of the prior art will become apparent to those of skill in the art upon a reading of the following descriptions and a study of the several figures of the drawing.

SUMMARY

In an embodiment, set forth by way of example and not limitation, a multichannel input device includes: an automatic number-of-channels and bit depth detector having a BCLK input, a LRCLK input, a number of channels NCHAN output and a bit depth B output; a digital audio interface (DAI) having a data DIN input, the BCLK input, the LRCLK input, an NCHAN input and a B input, the DAI having an output including data associated with an assigned channel; and a digital to analog converter (DAC) having a digital input coupled to the output of the DAI and an analog output. In a further example embodiment, the automatic number-of-channels and bit depth detector includes (1) a first counter and a first latch register for counting one of: a) a number N1 of BCLK cycles for one LRCLK cycle; b) a number N2 of BCLK cycles when LRCLK is HI; and c) a number N3 of BCLK cycles when LRCLK is LO; (2) and a second counter and a second latch register for counting one of N1, N2 and N3 that was not counted by the first counter; whereby the logic device determines a number of channels NCHAN and a bit depth B using at least two of N1, N2 and N3.

In an embodiment, set forth by way of example and not limitation, an integrated circuit device includes: (1) an integrated circuit chip having (a) an automatic number-of-channels and bit depth detector having a BCLK input, a LRCLK input, a number of channels NCHAN output and a bit depth B output, (b) a digital audio interface (DAI) having a data DIN input, the BCLK input, the LRCLK input, an NCHAN input and a B input, the DAI having an output including data associated with an assigned channel, and (c) a digital to analog converter (DAC) having a digital input coupled to the output of the DAI and an analog output; (2) an insulating package enclosing the integrated circuit chip; and (3) a plurality of contacts extending through the insulating package and electrically coupled to the integrated circuit chip. In an embodiment, the plurality of contacts is less than 10. In a further example embodiment, the automatic number-of-channels and bit depth detector includes a first counter and a first latch register for counting one of: a) a number N1 of BCLK cycles for one LRCLK cycle; b) a number N2 of BCLK cycles when LRCLK is HI; and c) a number N3 of BCLK cycles when LRCLK is LO; and a second counter and a second latch register for counting one of N1, N2 and N3 that was not counted by the first counter; whereby the logic device determines a number of channels NCHAN and a bit depth B using at least two of N1, N2 and N3.

In an embodiment, set forth by way of example and not limitation, a method for automatic number-of-channels detection for a multichannel input device includes: (1) using a first counter and a first latch register to count one of: a) a number N1 of BCLK cycles for one LRCLK cycle; b) a number N2 of BCLK cycles when LRCLK is HI; and c) a number N3 of BCLK cycles when LRCLK is LO; (2) using a second counter and a second latch register to count one of N1, N2 and N3 that was not counted by the first counter; and (3) determining with electronic logic a number of channels NCHAN from a least two of N1, N2 and N3. In another example embodiment, the first counter counts N1 and the second counter counts N2. The bit depth B continues to be equal to N2.

An advantage of certain example embodiments is that both the number of channels and the bit depth can be automatically determined for a multichannel input device. This can allow, for certain embodiments, a reduction of the number of integrated circuit (IC) leads and a smaller IC package.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures:

FIG. 4 is a table illustrating two example coding schemes, which are set forth by way of example and not limitation;

FIG. 5 is a flow diagram, set forth by way of example and not limitation, of a process implemented by the logic of FIG. 2;

FIG. 6 is a bottom plan view of and integrated circuit (IC) package suitable for use with the multichannel input device of FIG. 1; and FIG. 7 is a cross sectional view taken along line 7-7 of FIG. 6.

DETAILED DESCRIPTION OF EXAMPLE EMBODIMENTS

A multichannel input device 10 with automatic number-of-channels detection, set forth by way of example and not limitation, is an integrated electronic circuit device that includes an automatic number-of-channels and bit depth detector 12, a digital audio interface DAI 14, a digital-to-analog converter DAC 16, and an analog device 18. The detector 12, in this non-limiting example, has a BLK input, a LRCLK input, a number of channels NCHAN output and a bit depth B output. In this example embodiment, LRCLK is representative of a channel sync signal for an I2S mode, it being understood by one of skill in the art that there are other types of channel sync signals that can be used in other example embodiments. For example, in a TDM mode, the channel sync signal is not a left/right sync signal and, therefore, is usually simply referred to as "a channel sync signal." The DAI 14 has a data DIN input, a BCLK input, a LRCLK input, and NCHAN input and a B input. The DAI 14 is operative to output digital data associated with an assigned channel. The DAC 16 converts the digital data of the DAI to an analog signal, which is input into the analog device 18.

The analog device 18 can be, by way of non-limiting example, a class D audio amplifier. The DAI 14, DAC 16 and analog device 18 can be, by way of example, comparable to the digital audio interface, DAC and Class D Output Stage as set forth in the datasheet for MAX98355A/MAX98355B dated May, 2012, which is incorporated herein by reference in its entirety.

Figure 2:
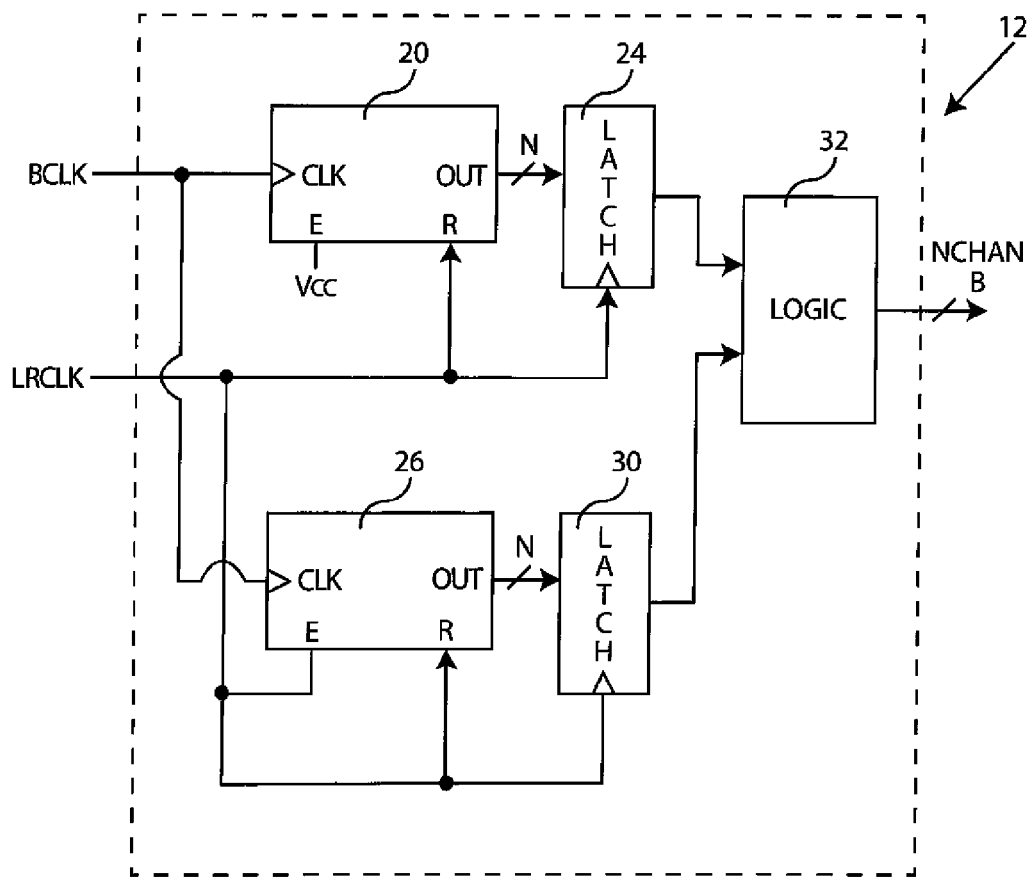
FIG. 2 is a block diagram, set forth by way of example and not limitation, of an automatic number-of-channels and bit depth detector of FIG. 1.

In FIG. 2, an automatic number-of-channels and bit depth detector 12, set forth by way of example and not limitation, includes a first counter 20 and a first latch register 24 for counting a number N1 of BCLK cycles for one LRCLK clock. The example automatic number-of-channels and bit depth detector 12, by way of further example, also includes a second counter 26, and a second latch register 30 for counting a number N2 of BCLK cycles when LRCLK is HI. This is accomplished by coupling the enable input E of counter 26 to LRCLK such that the counter 26 stops counting when LRCLK goes LO. The outputs of the latch register 24 and the latch register 30 are used by logic 32 to determine the number of channels NCHAN and the bit depth B, in this non-limiting example.

In an alternate example embodiment a number N3 of BCLK cycles when LRCLK is LO is counted instead a number N2 of BCLK cycles where LRCLK is HI. With reference to FIG. 2, this can be accomplished by providing an inverter before the enable input E of counter 26 such that the counter 26 stops counting when LRCK is HI. N1, N2 and N3 are related as N1=N2+N3. Therefore, N3 can be converted into N2 and vice versa by subtracting the other from N1, or N1 can be calculated as the sum of N2 and N3. In certain example embodiments, N1 and at least one of N2 and N3 are used to determine the number of channels NCHAN and the bit depth B. In another example embodiment, a number N2 of BCLK cycles when LRCLK is HI and a number N3 of BCLK cycles when LRCLK is LO are counted and N1 is not counted. This can be accomplished by, for example, coupling LRCLK to the enable input E of counter 20 with an inverter instead of having the enable input E of counter 20 being coupled to Vcc. N1 can subsequently be calculated from N2 and N3 with the equation N1=N2+N3, or a look-up table can use N2 and N3 as look-up parameters.

From the foregoing, it will be appreciated that, in these example embodiments, counting at least two of N1, N2 and N3 allows logic 32 accomplish automatic number-of-channels and bit depth detection. In certain example embodiments, all three of N1, N2 and N3 are counted, while in other alternative embodiments, only two of N1, N2 and N3 are counted. In example embodiments where only two of N1, N2 and N3 are counted, the omitted count can be calculated by using the equation N1=N2+N3.

Figure 3:
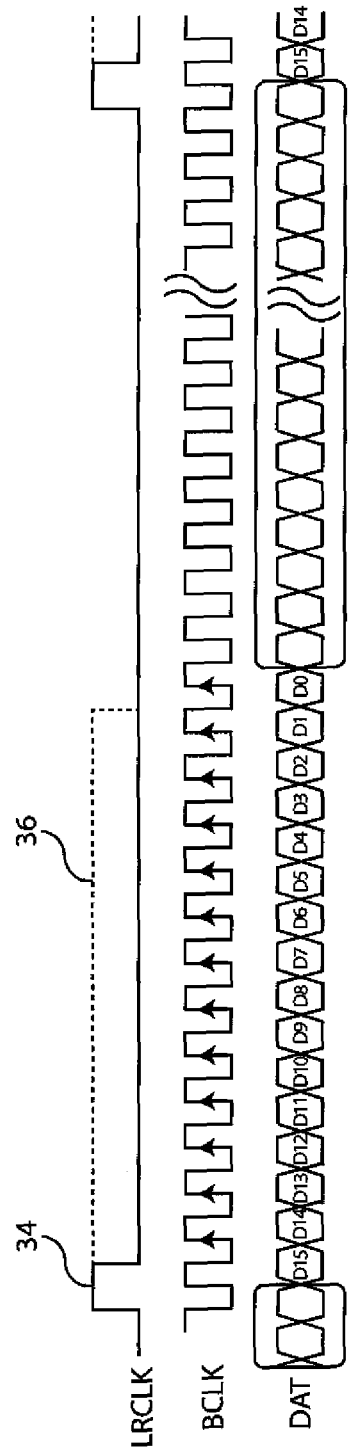
FIG. 3 is a timing diagram of example LRCLK, BCLK and DIN signals.

FIG. 3 is a timing diagram of example LRCLK, BCLK and DIN signals. The solid line pulse 34 illustrates a traditional LRCLK pulse for TDM interface, where the LRCLK pulse is one BCLK cycle in length. The broken line pulse 36 illustrates an alternative LRCLK pulse with encodes a bit depth in the duty cycle of the LRCLK channel sync signal. In further alternate embodiments, arbitrary data can be encoded in a sequence of LRCLK duty cycle lengths (e.g. gain control, filtering options, power sequencing, sample rate, etc.).

FIG. 4 is a table 38 illustrating two example coding schemes, which are set forth by way of example and not limitation. In table 38, columns 40 show the mode, bit depth B, number of channels NCHAN, and BCLKs per sample period. In columns 42, a first LRCLK pulse length in number of BCLKs and the corresponding LRCLK duty cycle are shown. In columns 44, a second LRCLK pulse length and LRCLK duty cycle are shown. It will be appreciated by those of skill in the art that the table 38 can be stored in a look-up table of the multichannel input device 10 (e.g. in a non-volatile digital memory format) for use by a logic device.

FIG. 5 is a flow diagram, set forth by way of example and not limitation, of a process 46 implemented by the automatic number-of-channels and bit depth detector 12 of FIG. 2, which includes electronic counters 20 and 26, latch registers 24 and 30, and logic 32. By way of non-limiting examples, logic 32 may be implemented by a state machine, a microprocessor, a microcontroller, discrete logic, etc. by way of non-limiting examples.

In FIG. 5, an example method 46 for automatic number-of-channels detection for a multichannel input device includes an operation 48 for counting a number N1 of BCLK cycles for one LRCLK cycle, an operation 50 for counting a number N2 of BCLK cycles when LRCK is HI, an operation 52 for determining the number of channels NCHAN=N1/N2; and an operation 54 for determining the bit depth B=N2. It should be noted that this method implements essentially the same result as set forth in column 42 of FIG. 4. In an alternate embodiment, the addition of alternative logic to determine bit depth and number of channels can implement essentially the same result as set forth in column 44 of FIG. 4.

It will be appreciated that example method 46 is only one example where N1 and N2 are counted. In other embodiments other combinations of N1, N2 and N3 are counted, e.g. N1 and N3, N2 and N3, and N1, N2 and N3. That is, a further example method includes the operations of: (1) using a first counter and a first latch register to count one of a) a number N1 of BCLK cycles for one LRCLK cycle; b) a number N2 of BCLK cycles when LRCLK is HI; and c) a number N3 of BCLK cycles when LRCLK is LO; (2) using a second counter and a second latch register to count one of N1, N2 and N3 that was not counted by the first counter; and (3) determining with electronic logic a number of channels NCHAN from a least two of N1, N2 and N3. The bit depth B continues, in this example embodiment, to be equal to N2.

Figure 1:
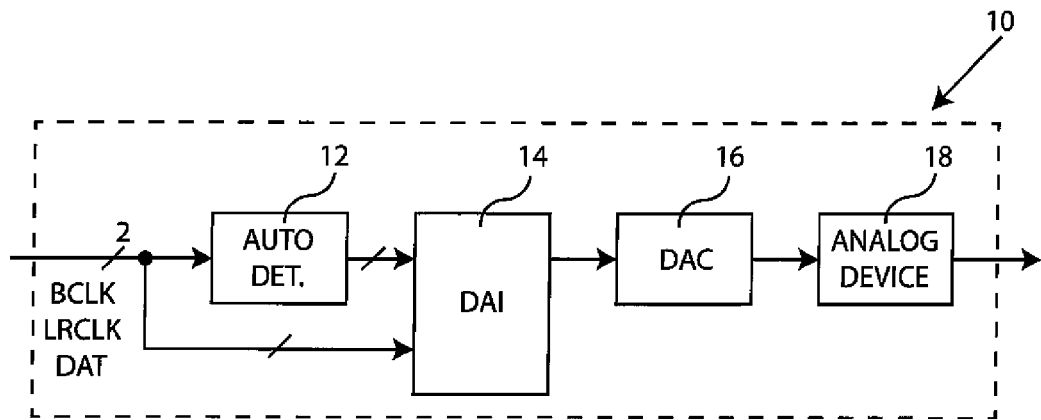
FIG. 1 is a block diagram, set forth by way of example and not limitation, of a multichannel input device with automatic number-of-channels detection.

FIG. 6 is a bottom plan view of and integrated circuit (IC) 56 incorporating a multichannel input device 10 of FIG. 1, and FIG. 7 is a cross sectional view of IC 56 taken along line 7-7 of FIG. 6. IC 56, in this non-limiting example, is a wafer-level packaging (WLP) IC which can be manufactured by building up the package interconnect structure directly on the silicon circuit substrate. By way of non-limiting example, a dielectric repassivation polymer film 58 can be applied over an active surface of a wafer, die or "chip" 62 typically comprising silicon. The film 58 preferably provides both mechanical stress relief for the ball 60 attachment and electrical isolation on the die surface. Electrically conductive vias 66 can be imaged within the polymer film 58, providing electrical contact to the IC bonding pads. Backside wafer lamination 64, which can be a protective polymer film, can provide both mechanical and UV light protection of the backside of the die.

It will therefore be appreciated that an integrated circuit device 56 can include an integrated circuit chip 62, an insulating package 58/64 enclosing the integrated circuit chip 56, and a plurality of contacts 60/66 extending through the insulating package and electrically coupled to the integrated circuit chip 62. In this non-limiting example, a WLP package is used, although other packages can be used as will be appreciated by those of skill in the art. In this example, the contacts are provided by a set of conductive contact balls 60 arranged in a square array of 3×3, for a total of 9 conductive ball contacts.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A multichannel input device comprising:
    an automatic number-of-channels and bit depth detector having a bit clock (BCLK) input, a left/right clock (LRCLK) input, a number of channels NCHAN output and a bit depth B output, wherein the automatic number-of-channels and bit depth detector includes a plurality of counters and a logic device;
    a digital audio interface (DAI) having a data DIN input, the BCLK input, the LRCLK input, an NCHAN input and a B input, the DAI having an output including data associated with an assigned channel; and
    a digital to analog converter (DAC) having a digital input coupled to the output of the DAI and an analog output;
    wherein the automatic number-of-channels and bit depth detector includes:
    a) a first counter and a first latch register for counting one of
        i) a number N1 of BCLK cycles for one LRCLK cycle,
        ii) a number N2 of BCLK cycles when LRCLK is HI,
        iii) a number N3 of BCLK cycles when LRCLK is LO; and
    b) a second counter and a second latch register for counting one of N1, N2 and N3 that was not counted by the first counter;
    whereby the logic device determines a number of channels NCHAN and a bit depth B using at least two of N1, N2 and N3.

2. A multichannel input device as recited in claim 1 wherein the first counter counts N1 and the second counter counts N2.

3. A multichannel input device as recited in claim 2 wherein the logic device calculates NCHAN as the quotient of N1 divided by N2, and determines B to be equal to N2.

4. A multichannel input device as recited in claim 2 wherein the logic device uses a look-up table to determine NCHAN from N1 and N2, and determines B to be equal to N2.

5. A multichannel input device as recited in claim 1 further comprising a third counter and a third latch register for counting the remaining one of N1, N2 and N3 that was not counted by the first counter and the second counter.

6. A multichannel input device as recited in claim 1 wherein an uncounted one of N1, N2 and N3 is calculated from counted ones of N1, N2 and N3 using the equation N1=N2+N3.

7. An integrated circuit device comprising:
    an integrated circuit chip including:
        an automatic number-of-channels and bit depth detector having a bit clock (BCLK) input, a left/right clock (LRCLK) input, a number of channels NCHAN output and a bit depth B output, wherein the automatic number-of-channels and bit depth detector includes a plurality of counters and a logic device;
        a digital audio interface (DAI) having a data DIN input, the BCLK input, the LRCLK input, an NCHAN input and a B input, the DAI having an output including data associated with an assigned channel; and
        a digital to analog converter (DAC) having a digital input coupled to the output of the DAI and an analog output;
        wherein the automatic number-of-channels and bit depth detector includes:

a) a first counter and a first latch register for counting one of
  i) a number N1 of BCLK cycles for one LRCLK cycle,
  ii) a number N2 of BCLK cycles when LRCLK is HI,
  iii) a number N3 of BCLK cycles when LRCLK is LO; and
b) a second counter and a second latch register for counting one of N1, N2 and N3 that was not counted by the first counter;
whereby the logic device determines a number of channels NCHAN and a bit depth B using at least two of N1, N2 and N3;
an insulating package enclosing the integrated circuit chip; and
a plurality of contacts extending through the insulating package and electrically coupled to the integrated circuit chip.

8. An integrated circuit device as recited in claim 7 wherein the first counter counts N1 and the second counter counts N2.

9. An integrated circuit device as recited in claim 8 wherein the logic device calculates NCHAN as the quotient of N1 divided by N2, and determines B to be equal to N2.

10. An integrated circuit device as recited in claim 8 wherein the logic device uses a look-up table to determine NCHAN and B from N1 and N2.

11. An integrated circuit device as recited in claim 7 wherein the integrated circuit chip further includes an analog device coupled to the analog output of the DAC.

12. An integrated circuit device as recited in claim 7 wherein the plurality of contacts is less than ten.

13. A method for automatic number-of-channels detection for a multichannel input device comprising:
  using an first counter and a first latch register to count one of:
    a) a number N1 of bit clock (BCLK) cycles for one left/right clock (LRCLK) cycle;
    b) a number N2 of BCLK cycles when LRCLK is HI; and
    c) a number N3 of BCLK cycles when LRCLK is LO;
  using a second counter and a second latch register to count one of N1, N2 and N3 that was not counted by the first counter; and
  determining with electronic logic a number of channels NCHAN from a least two of N1, N2 and N3.

14. A method for automatic number-of-channels detection for a multichannel input device as recited in claim 13 wherein the first counter counts N1 and the second counter counts N2.

15. A method for automatic number-of-channels detection for a multichannel input device as recited in claim 14 wherein an electronically stored lookup table is used to determine NCHAN from N1 and N2.

16. A method for automatic number-of-channels detection for a multichannel input device as recited in claim 14 wherein NCHAN is the quotient of N1 divided by N2 and the bit depth B is equal to N2.

* * * * *